(12) United States Patent
Watanabe et al.

(10) Patent No.: US 7,990,723 B2
(45) Date of Patent: Aug. 2, 2011

(54) HOUSING STRUCTURE OF ACOUSTIC CONTROLLER

(75) Inventors: Tsutomu Watanabe, Hamamatsu (JP); Hisashi Nagai, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 117 days.

(21) Appl. No.: 12/030,285

(22) Filed: Feb. 13, 2008

(65) Prior Publication Data

US 2008/0198558 A1 Aug. 21, 2008

(30) Foreign Application Priority Data

Feb. 16, 2007 (JP) ................................ 2007-036455

(51) Int. Cl.
*H05K 5/00* (2006.01)
*H05K 7/16* (2006.01)
*H05K 1/14* (2006.01)
*F24F 7/00* (2006.01)
*F24F 7/007* (2006.01)
*F24F 9/00* (2006.01)
*A47B 77/08* (2006.01)

(52) U.S. Cl. ........ 361/724; 361/725; 361/726; 361/736; 454/184; 454/185; 454/193; 312/236

(58) Field of Classification Search .................. 361/679, 361/102, 9, 31, 52, 54, 688–747; 454/184–193; 312/236; 381/118–120; 369/4
See application file for complete search history.

(56) References Cited

U.S. PATENT DOCUMENTS

| 5,675,557 | A | 10/1997 | Hubinger et al. |
| D490,800 | S | 6/2004 | Kitazawa |
| 7,106,580 | B2 * | 9/2006 | Kugimiya et al. ....... 361/679.22 |
| 2002/0105783 | A1 * | 8/2002 | Kitahara ..................... 361/695 |
| 2004/0066631 | A1 | 4/2004 | Natsume et al. |
| 2005/0211646 | A1 * | 9/2005 | Watanabe et al. ............... 211/26 |
| 2005/0259532 | A1 | 11/2005 | Roman et al. |
| 2006/0082973 | A1 * | 4/2006 | Egbert et al. .................. 361/709 |
| 2006/0221776 | A1 | 10/2006 | Roman et al. |

FOREIGN PATENT DOCUMENTS

EP 1 406 478 A2 4/2004

(Continued)

OTHER PUBLICATIONS

European Search Report mailed Feb. 9, 2010, for EP Application No. 08101208.0, seven pages.

*Primary Examiner* — Jayprakash N Gandhi
*Assistant Examiner* — Jerry Wu
(74) *Attorney, Agent, or Firm* — Morrison & Foerster LLP

(57) ABSTRACT

A housing structure of an acoustic controller, in which a lower case of the controller has an increased rigidity and improved moldability. The lower case is integrally formed by a resin and has a bottom surface thereof disposed to face a tabletop surface when the controller is in a stationarily placed thereon. The bottom surface of the lower case is formed to have a concave-forming portion that defines a concave space communicating with the outside of the controller on the left and right sides thereof and which is upward convex as viewed when the controller is stationarily placed, thus increasing the rigidity of the lower case. Bosses and vertical ribs formed to project upward from a horizontal part of the concave-forming portion of the lower case each have a reduced height, thereby improving the moldability of the lower case.

3 Claims, 8 Drawing Sheets

| | FOREIGN PATENT DOCUMENTS | | |
|---|---|---|---|
| EP | 1 406 478 A3 | 4/2004 |
| GB | 2 073 994 A | 10/1981 |
| GB | 2 079 103 A | 2/1982 |
| JP | 59-086340 A | 5/1984 |
| JP | 2001-177267 A | 6/2001 |
| JP | 1256520 | 12/2002 |
| JP | 2003-058283 A | 2/2003 |
| JP | 2004-128305 | 4/2004 |
| JP | 3815559 | 6/2006 |
| WO | WO-2006/100999 A1 | 9/2006 |

* cited by examiner

HOUSING STRUCTURE OF ACOUSTIC CONTROLLER

BACKGROUND OF THE INVENTION

1. Field of the Invention

The present invention relates to a housing structure of an acoustic controller, and more particularly, to a housing structure of an acoustic controller that makes the controller usable both in a stationarily placed state and in a rack-mounted state.

2. Description of the Related Art

Conventionally, there has been known an acoustic controller such as a mixer apparatus that can be used both in a state stationarily placed on a flat surface such as tabletop surface, desktop surface, and floor surface and in a state mounted on a rack. Since there are disposed circuit boards or other heat generating component parts in an acoustic controller housing, the interior of the housing must be cooled.

Japanese Design Registration No. 1256520, for example, discloses an acoustic controller in which heat radiation openings are formed in side walls of the housing for cooling the interior of the housing. Also known is an acoustic controller having heat radiation openings formed in a bottom surface of the housing.

Japanese Patent Publication No. 3815559 discloses an acoustic controller (electronic apparatus) having intake ports formed in front and rear surfaces of a metallic housing (casing), circuit boards disposed vertically inside a rear part of the housing, and exhaust ports formed in an upper rear surface of the housing. When the acoustic controller is in a stationarily placed state, an air flow is generated flowing from the intake ports to the exhaust ports, whereby the circuit boards are cooled.

The acoustic controller disclosed in Japanese Design Registration No. 1256520, however, has a drawback that the efficiency of heat radiation becomes low when rack-mounted because of a small distance from the heat radiation openings of the housing to side walls of the rack. The above described prior art acoustic controller having heat radiation openings formed in the housing bottom surface also has a drawback that heat radiation efficiency is lowered when the controller is stationarily placed on a tabletop surface so that the distance between the heat radiation openings and the tabletop surface decreases.

The acoustic controller disclosed in Japanese Patent Publication No. 3815559 has its housing having a large height (thickness) especially at the rear part thereof. If a lower part (lower case) of the controller housing is formed by a resin, such a resin lower case provides a smaller rigidity than that of a metal lower case. Besides, the resin lower case must be provided with thickened portions such as reinforcement ribs and bosses for mounting an upper unit (upper casing part) and circuit boards thereon. In the case of the lower case being large in thickness, the thickened portions formed therein become large in height, which can worsen the moldability of the lower case. Generally, a mixer apparatus is made larger in height at its rear part than at a front part thereof to improve the user's operability. In the acoustic controller disclosed in Japanese Patent Publication No. 3815559 having the circuit boards vertically disposed, the thickened portions formed at the rear part of the controller are noticeably large in height, which is disadvantageous in improving the moldability and poses a problem.

SUMMARY OF THE INVENTION

The present invention provides a housing structure of an acoustic controller capable of increasing the rigidity of and improving the moldability of a lower case of the acoustic controller.

The present invention also provides a housing structure of an acoustic controller capable of increasing the rigidity of a lower case of the acoustic controller and effectively cooling heat generating component parts provided therein.

According to one aspect of this invention, there is provided a housing structure of an acoustic controller comprising a housing comprised of a lower case and an upper unit having its operation panel surface, the acoustic controller being adapted to be usable both in a stationarily placed state where it is stationarily placed on a flat surface and in a rack-mounted state, wherein the lower case is integrally formed by a resin and has a bottom surface thereof adapted to face the flat surface when the acoustic controller is in the stationarily placed state, the bottom surface of the lower case has a concave-forming portion thereof which is convex upward when the acoustic controller is in the stationarily placed state, and at least one thickened portion is integrally formed in the concave-forming portion of the lower case to extend in a direction including a vertical direction component as viewed when the acoustic controller is in the stationarily placed state.

With the housing structure of this invention, the rigidity of the lower case can be increased by having the concave-forming portion in the bottom surface of the lower case, and the moldability of the lower case can be improved by having the thickened portion integrally formed in the lower case with a reduced height.

In this invention, the concave-forming portion of the lower case can be adapted to define a concave space communicating with outside of the acoustic controller when the acoustic controller is in the stationarily placed state, and the concave-forming portion can be formed with at least one first heat radiation opening.

In that case, it can be ensured that the interior of the housing is sufficiently cooled when the acoustic controller is in the stationarily placed state.

The housing can be formed with at least one second heat radiation opening that is disposed in a vertical positional relation to the first heat radiation opening when the acoustic controller is in the rack-mounted state.

In that case, a smooth air flow can be generated between the first and second heat radiation openings when the acoustic controller is rack-mounted, whereby the interior of the housing can be sufficiently cooled when the controller is in the rack-mounted state.

The thickened portion of the concave-forming portion of the lower case can be at least one of a boss for mounting the upper unit on the lower case, a boss for mounting a board on the lower case, and a rib for ensuring rigidity of the lower case.

In that case, the moldability of the lower case can be improved by having the boss and/or the rib of a reduced height.

According to a second aspect of this invention, there is provided a housing structure of an acoustic controller comprising a housing comprised of a lower case and an upper unit having its operation panel surface, the acoustic controller being adapted to be usable both in a stationarily placed state where it is stationarily placed on a flat surface and in a rack-mounted state, wherein the lower case is integrally formed by a resin and has a bottom surface thereof adapted to face the flat surface when the acoustic controller is in the stationarily placed state, the bottom surface of the lower case is formed with a concave-forming portion which is convex upward when the acoustic controller is in the stationarily placed state, at least one heat generating component part is disposed inside the housing, the concave-forming portion of the lower case has a part thereof formed with at least one heat radiation opening and extending in a direction including a vertical direction component as viewed when the acoustic controller is in the stationarily placed state, and the housing has at least one second heat radiation opening formed therein on a side thereof opposite from the first heat radiation opening, with the heat generating component part interposed between the first and second heat radiation openings.

With the housing structure of this invention, the rigidity of the lower case can be increased by having the concave-forming portion formed in the bottom surface of the lower case, and the heat generating component parts can effectively be cooled by having the first and second heat radiation openings formed in the housing.

The first and second heat radiation openings can be disposed in a vertical positional relation to each other when the acoustic controller is in the rack-mounted state.

In that case, a smooth air flow can be generated in the housing between the first and second heat radiation openings when the acoustic controller is rack-mounted, whereby the interior of the housing can be sufficiently cooled when the controller is in the rack-mounted state.

Further features of the present invention will become apparent from the following description of an exemplary embodiment with reference to the attached drawings.

DETAILED DESCRIPTION OF THE PREFERRED EMBODIMENT

The present invention will now be described in detail below with reference to the drawings showing a preferred embodiment thereof.

Figure 1A:
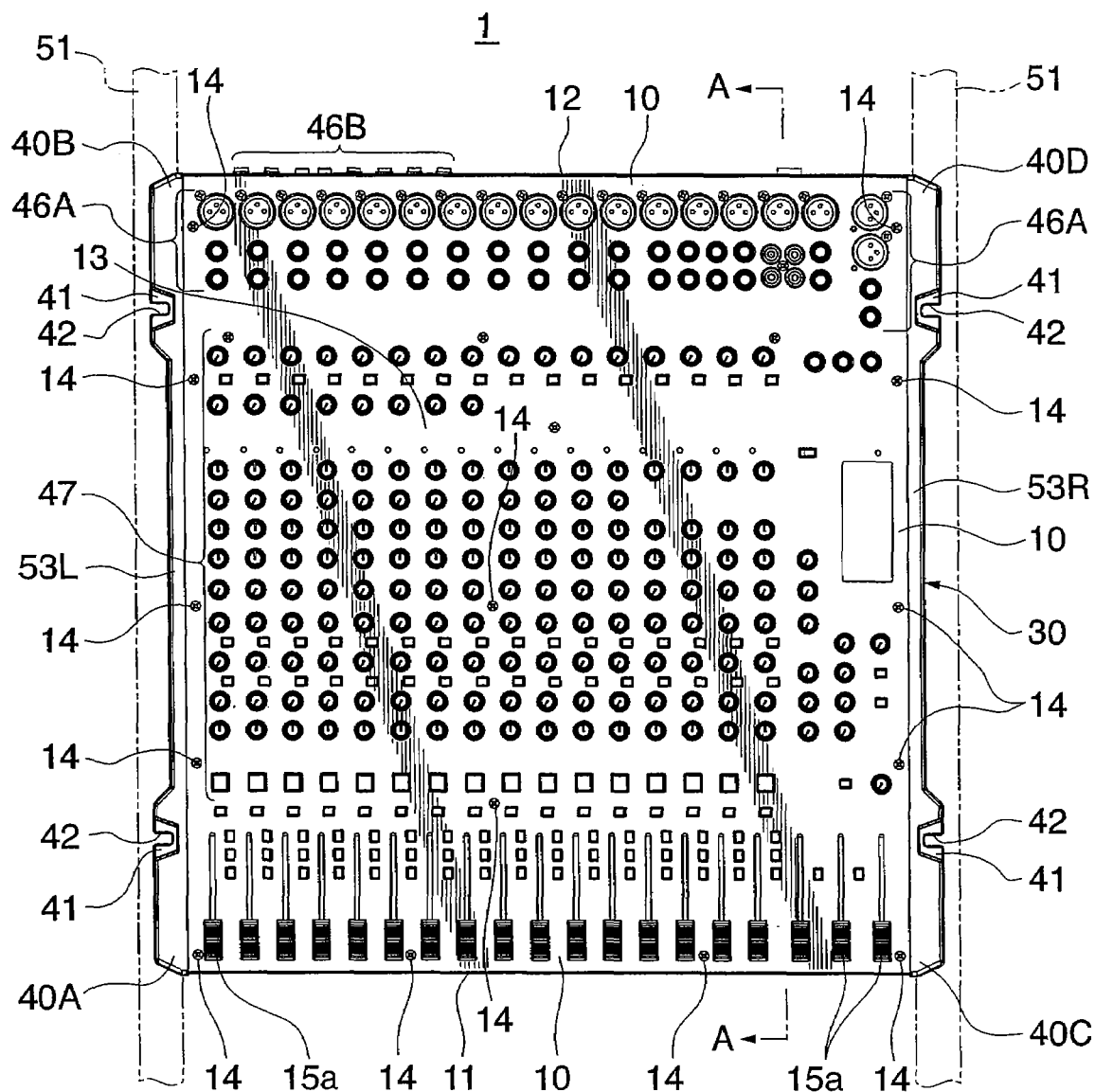
FIG. 1A is a plan view showing an acoustic controller to which a housing structure according to one embodiment of this invention is applied.
Figure 1B:
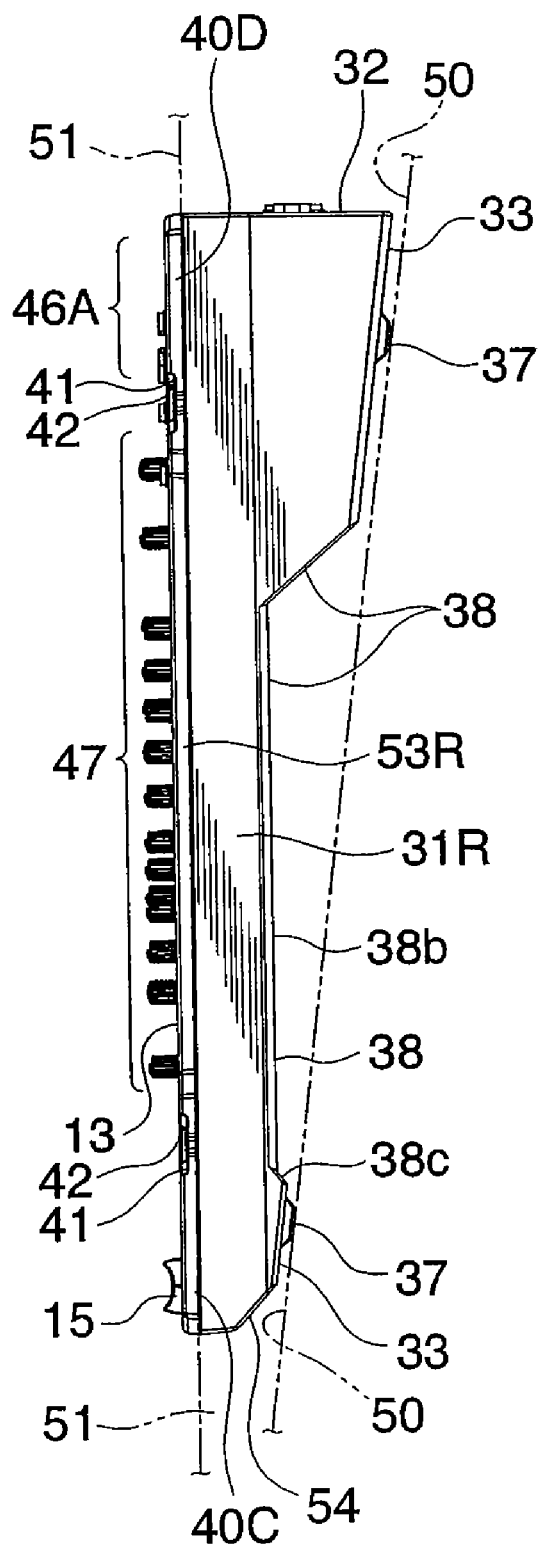
FIG. 1B is a right side view of the acoustic controller.

FIGS. 1A and 1B respectively show in plan view and right side view an acoustic controller to which a housing structure according to one embodiment of this invention is applied. The acoustic controller 1 is configured as a so-called mixer apparatus, and includes a housing comprised of an upper unit 10 and a lower case 30, which are adapted to be assembled together.

The acoustic controller 1 is configured to be usable in either state of being stationarily placed on a flat surface of a floor, a tabletop or the like (hereinafter referred to as "in stationarily placed state" or "in stationary use") or being mounted to a rack 51 (hereinafter referred to as "in rack-mounted state" or "in rack mount use").

In the following, unless otherwise specified, the vertical direction of the acoustic controller 1 is determined under an assumption that the controller is in stationary use although the direction of the controller is different between when the controller is in stationary use and in rack mount use. In stationary use, a user is on the side of a front surface 11 of the upper unit 10, which is a part of a front portion of the controller 1. In the following, a front surface 11 side of the upper unit 10 will be referred to as the "front side" of the controller 1, whereas a rear surface 12 side of the upper unit 10, which is a part of a rear portion of the controller, will be referred to as the "rear side" of the controller 1 unless otherwise specified.

The acoustic controller 1 has an operation panel surface 13 on its upper side and has a plurality of legs 37 on its lower side. As shown in FIG. 1B, when the controller 1 is in stationary use, the legs 37 are made in contact with a tabletop surface 50, and a bottom plate 33 is disposed to face the tabletop surface 50. The controller 1 is made higher (thicker) toward the rear portion thereof. When the controller 1 is in stationary use, the operation panel surface 13 is inclined downward toward the front portion thereof for ease of user operation. It is assumed that a rack 51 is installed vertically. In that case, the operation panel surface 13 of the rack-mounted acoustic controller 1 extends vertically in a facing relation with the user. The angle of installation of the rack 51 is shown by way of example in FIGS. 1A and 1B. The rack 51 can be installed at any angle so long as the operation panel surface 13 is disposed in a direction suitable for easy user operation when the controller 1 is in rack mount use.

Figure 2A:
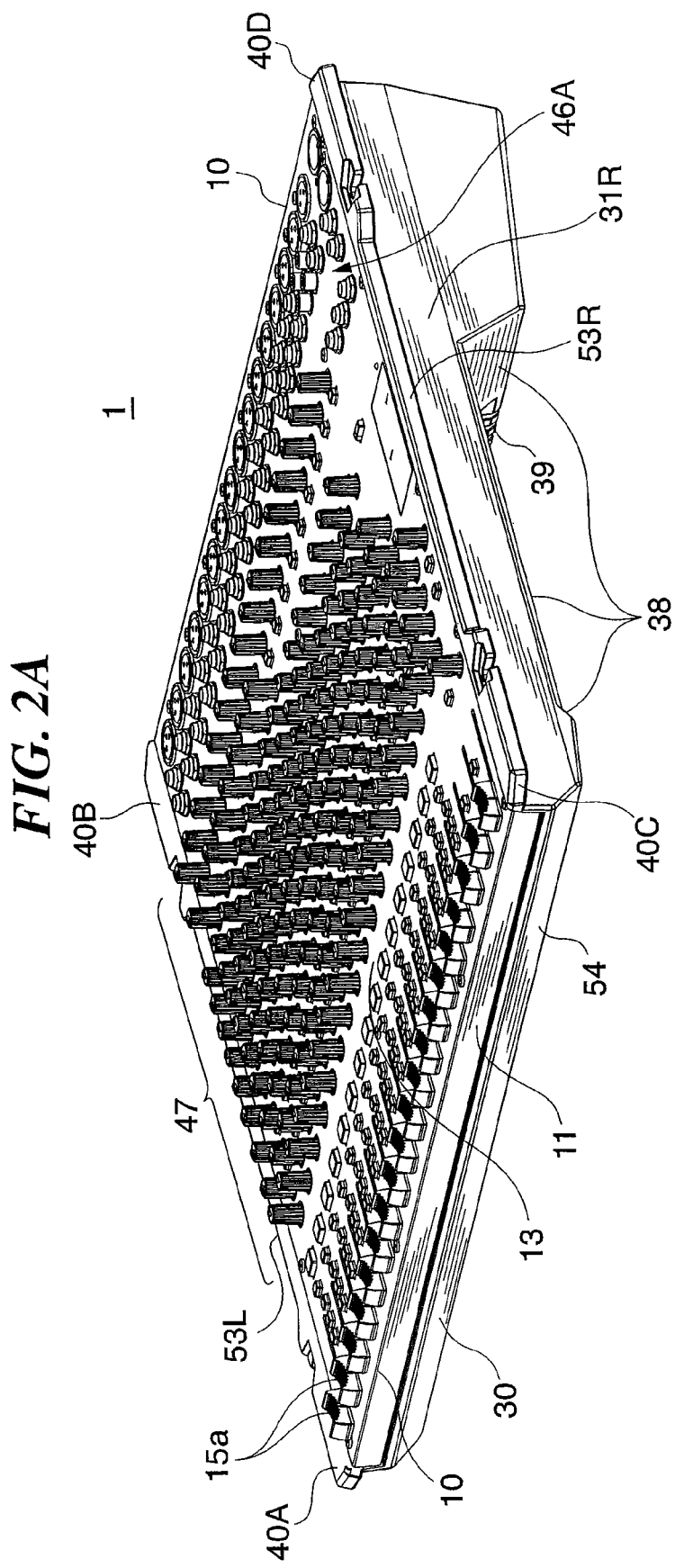
FIG. 2A is a perspective view of the acoustic controller as seen from obliquely above.
Figure 2B:
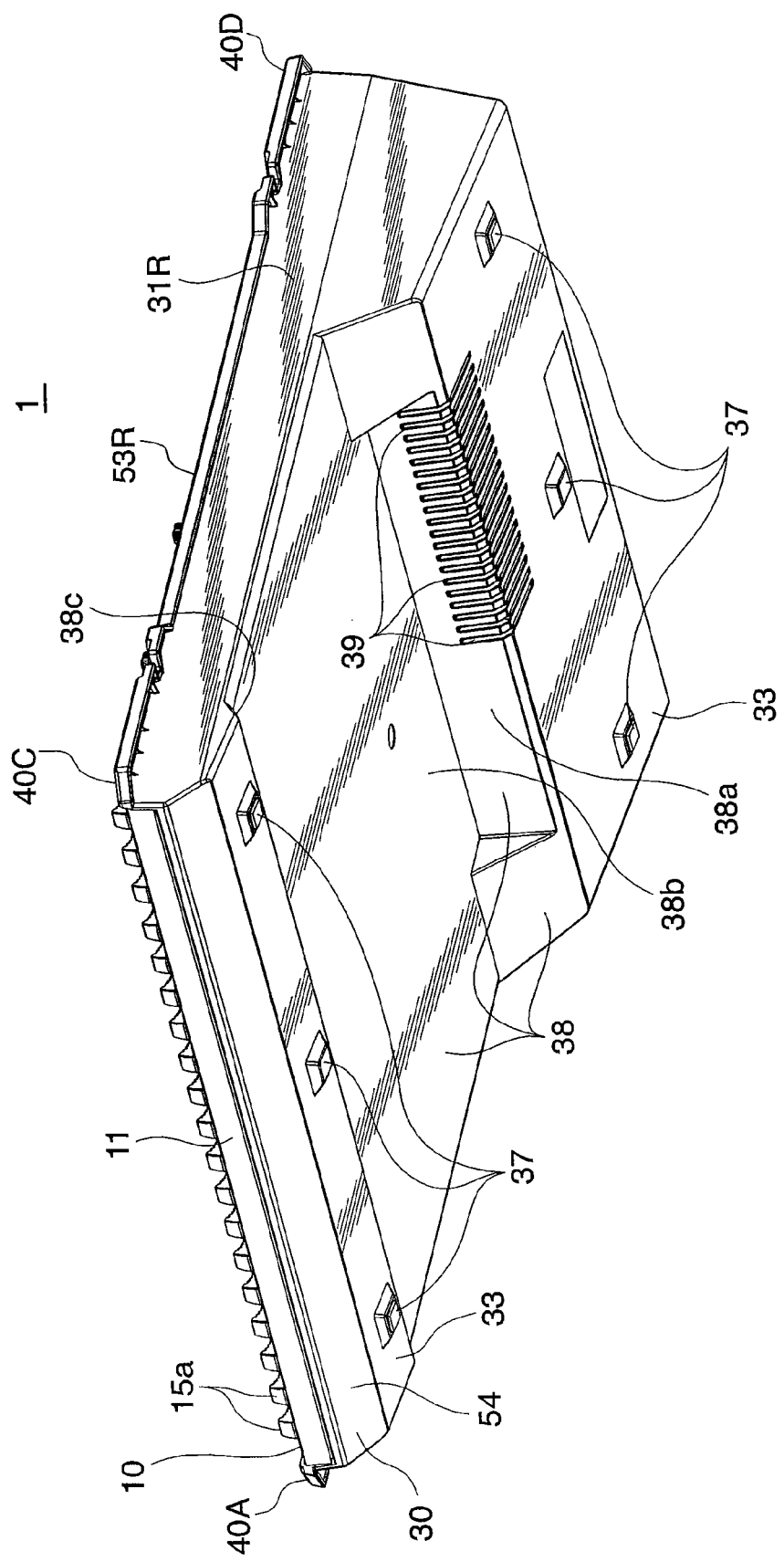
FIG. 2B is a perspective view of the acoustic controller as seen from obliquely below.
Figure 3:
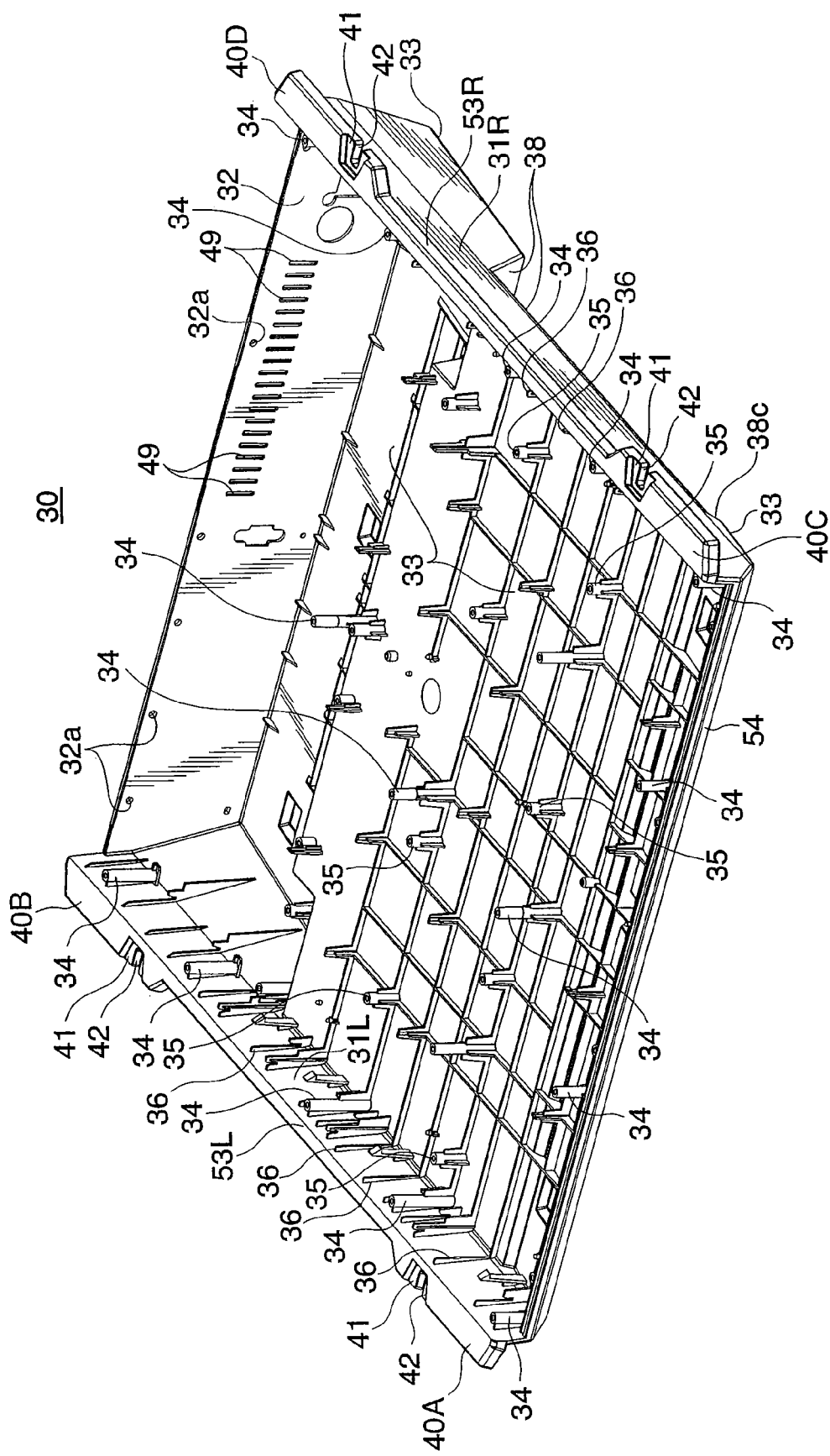
FIG. 3 is a perspective view of a lower case as seen from obliquely above.
Figure 4A:
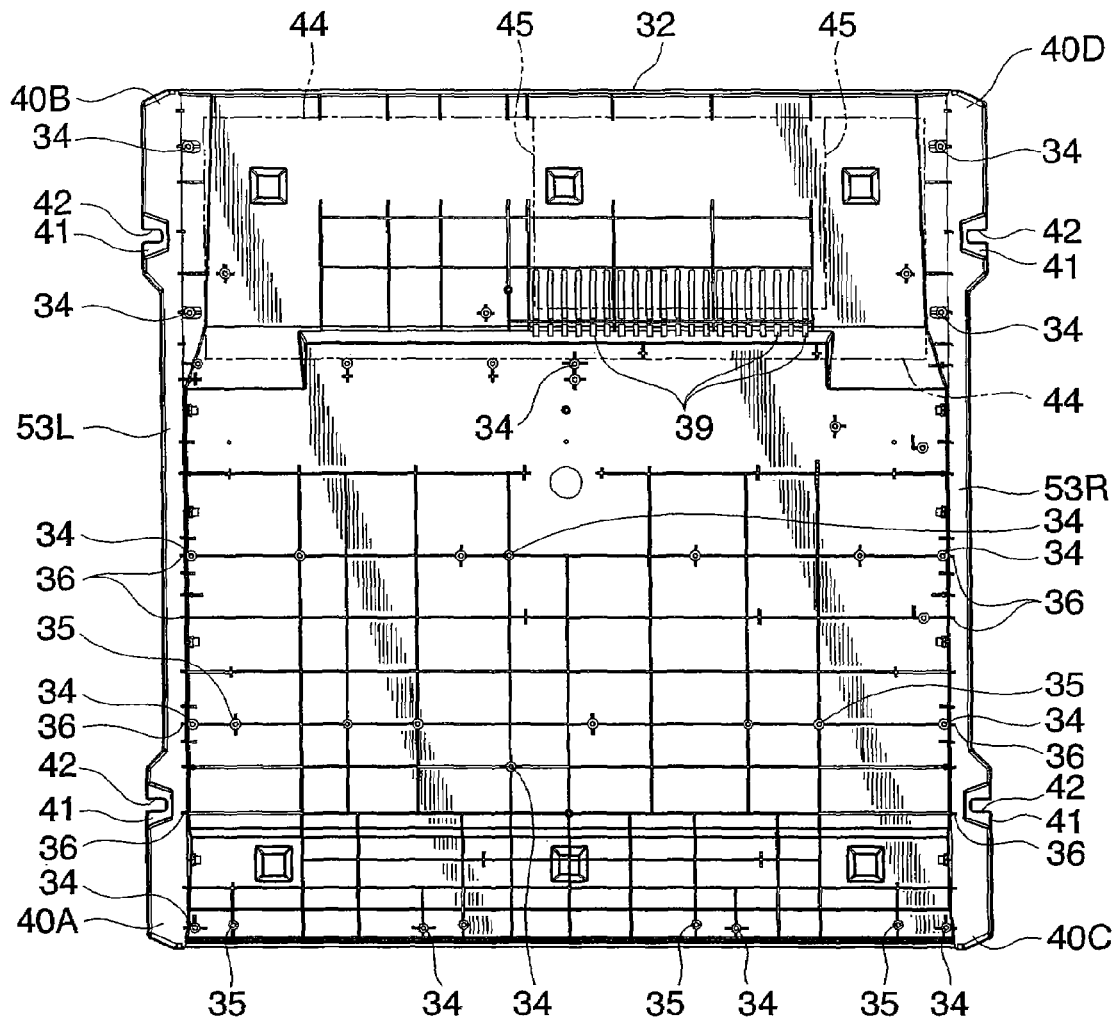
FIG. 4A is a plan view of the lower case.
Figure 4B:
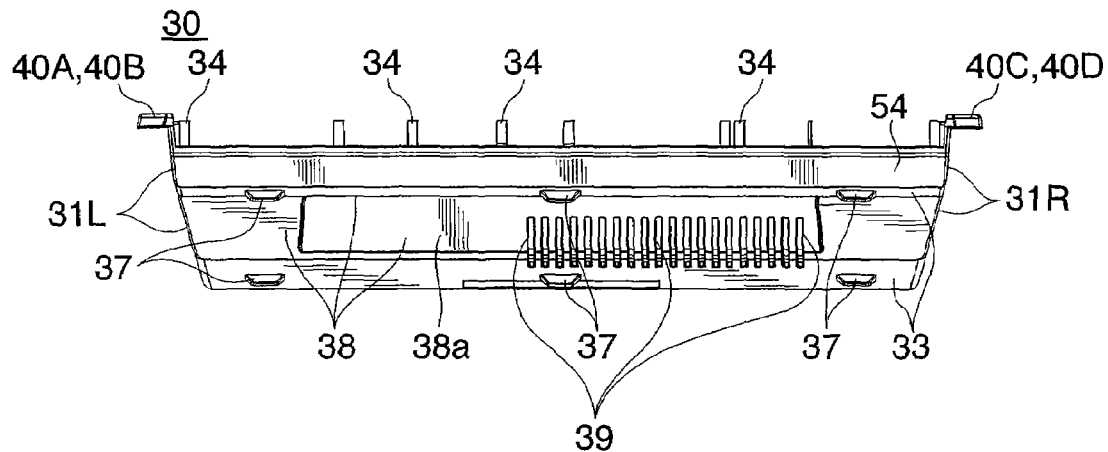
FIG. 4B is a front view of the lower case.
Figure 5A:
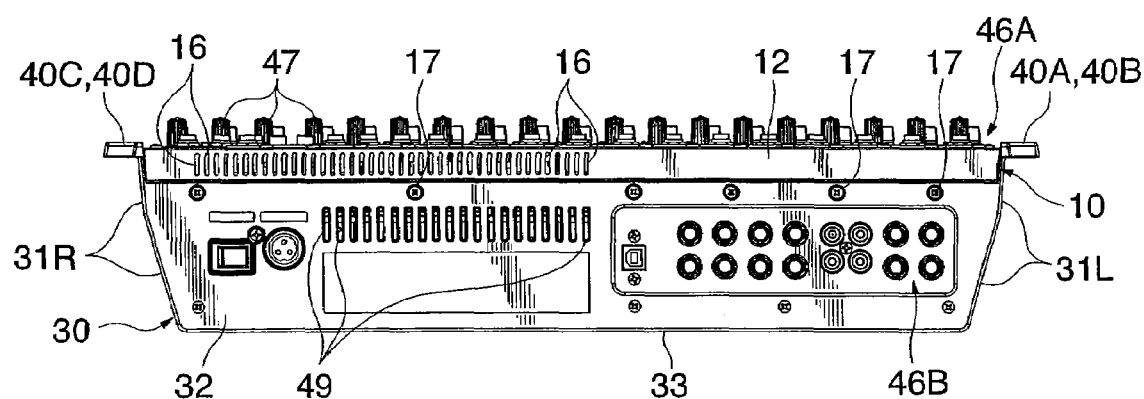
FIG. 5A is a rear view of the acoustic controller.
Figure 5B:
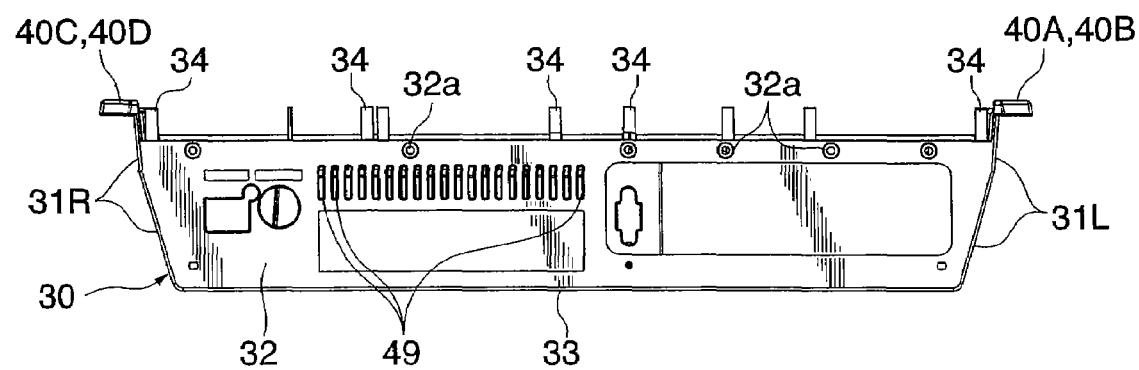
FIG. 5B is a rear view of the lower case.
Figure 6:
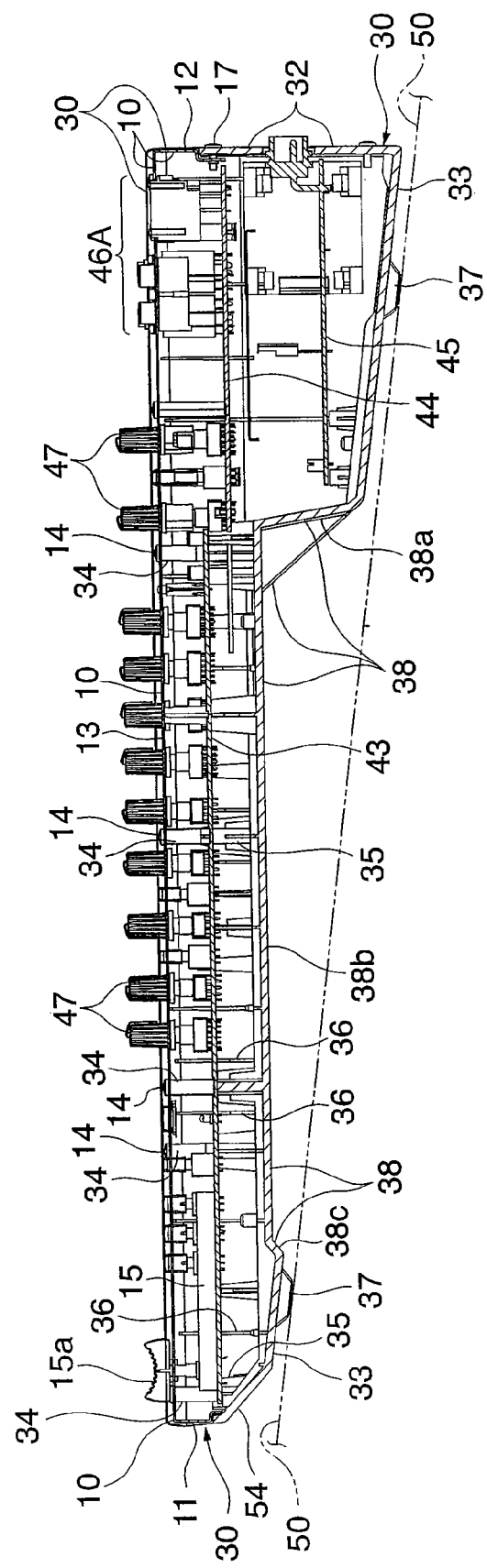
FIG. 6 is a section view taken along line A-A shown in FIG. 1A.

FIGS. 2A and 2B show the acoustic controller 1 in perspective view, FIG. 3 shows the lower case 30 in perspective view, FIGS. 4A and 4B show the lower case 30 in plan view and front view, FIGS. 5A and 5B show the acoustic controller 1 and the lower case 30 in rear view, and FIG. 6 is a section view taken along line A-A shown in FIG. 1A. In a strict sense, FIG. 4B shows the front surface of the lower case 30 and FIGS. 5A and 5B show the rear surfaces of the controller 1 and the lower case 30 in a state where the operation panel surface 13 is disposed horizontally.

The upper unit 10 is made of metal such as a sheet metal or aluminum, and is formed into a shallow inverted U-shape as seen in side view of FIG. 6. The upper unit 10 has a horizontal upper surface that constitutes the operation panel surface 13 whose front and rear portions are bent downward and constitute the front and rear surfaces 11, 12 of the upper unit 10 (see, FIGS. 1A, 2A, 2B, 5A, and 6). Since being formed into inverted U-shape, the upper unit 10 is high in bending stiffness in the left-to-right direction thereof. The upper unit 10 is formed at its rear surface 12 with heat radiation slits 16 (see FIG. 5A). The operation panel surface 13 is formed with holes to which screws 14 are screwed into the lower case 30 as described later, and is formed with holes through which operator groups 47, input/output units 46A, etc. are exposed (see FIG. 6).

As shown in FIGS. 3 to 5B, the lower case 30 includes a front plate 54, a rear plate 32, a left plate 31L, a right plate 31R, and a bottom plate 33, and is formed into a rectangular dish shape as viewed in plan. The lower case 30 has an open upper surface thereof to which the upper unit 10 is attached. The lower case 30 is integrally die-molded from a synthetic resin. The front surface 11 of the upper unit 10 cooperates with the front plate 54 of the lower case 30 to form the front portion of the acoustic controller 1, whereas the rear surface 12 cooperates with the rear plate 32 to form the rear portion of the controller 1. It is not inevitably necessary that each of the front and rear portions of the controller 1 is constructed by corresponding parts of the upper unit 10 and the lower case 30.

The left and right plates 31L, 31R of the lower case 30 extend upward slightly beyond the front and rear plates 54, 32 of the lower case 30, as viewed in the vertical direction. Upper portions of the left and right plates 31L, 31R are formed into brim portions 53L, 53R extending in the front-to-rear direction of the lower case 30 and protruded outward in the left-to-right direction thereof. The brim portions 53L, 53R of the lower case 30 extend horizontally. Front and rear portions of the brim portion 53L are further protruded leftward and formed into flanges 40A, 40B of the lower case 30. Similarly, front and rear portions of the brim portion 53R are further protruded rightward to be formed into flanges 40C, 40D.

Each of the flanges 40A to 40D is formed with a mounting portion 41 and a notched portion 42. Since the brim portions 53L, 53R are formed horizontally over the entire length of the lower case 30 in the front-to-rear direction, the left and right plates 31L, 31R are suppressed from being deformed such as being inwardly inclined or being undulated after the molding of the lower case 30. Moreover, the bending stiffness of the left and right plates 31L, 31R in the front-to-rear direction can be increased, whereby the rigidity of the lower case 30 mainly in the front-to-rear direction can also be increased. The flanges 40A to 40D function as mounting portions that are used for rack mounting the acoustic controller 1. The completed acoustic controller 1 is mounted to the rack 51 by being fixed at the mounting portions 41 of the lower case 30 to the rack 51 using screws (not shown) which are inserted though the notched portions 42 of the lower case 30 (see FIG. 1A).

As shown in FIG. 2B, the bottom plate 33 of the lower case 30 has its intermediate portion 38 which is convex upward and extends from near a front end of the bottom plate 33 to mid-part of a rear half thereof, as viewed in the front-to-rear direction of the lower case 30. The intermediate portion 38 of the bottom plate 33, i.e., a concave-forming portion, is convex upward and defines a concave space that is defined over the entire width of the lower case 30 in the left-to-right direction thereof and in communication with the outside of the acoustic controller 1 on the left and right sides thereof in a state where the controller 1 is stationarily placed (see FIG. 1B). The concave-forming portion 38 has an inclined front part 38c, an inclined rear part 38a extending nearly vertically, and a horizontal part 38b extending between upper ends of the inclined parts 38a, 38c, and is formed into a shallow inverted U-shape, as seen from side (see FIG. 6). The horizontal part 38b of the lower case 30 extends parallel to the brim portions 53L, 53R of the lower case 30. The acoustic controller 1 has its thickness becoming smaller toward the front portion thereof. Due to the provision of the inverted U-shaped concave-forming portion 38 in the lower case 30, the rigidity of the lower case 30 increases mainly in the left-to-right direction thereof. Heat radiation slits 39 are formed in the inclined part 38a of the bottom plate 33 and formed in that part of the bottom plate 33 which is adjacent to the inclined part 38a (see FIGS. 2B, 4A and 4B).

As shown in FIGS. 3 and 5B, fastening holes 32a are formed in upper part of the rear plate 32 of the lower case 30, and heat radiation slits 49 are formed in an upper right part of the rear plate 32.

As shown in FIGS. 3 to 5B, the bottom plate 33 of the lower case 30 has its upper surface formed with thickened portions such as reinforcing ribs and bosses to which component parts are mounted. For example, bosses 34 used for mounting thereon the upper unit 10 are formed in those portions of the bottom plate 33 which are adjacent to the left and right plates 31L, 31R and formed in front and intermediate portions of the bottom plate 33. Furthermore, bosses 35 used for mounting thereon an operator board 43 (see FIG. 6), described later, etc. are formed in appropriate places of the bottom plate 33.

Specifically, the bosses 34, 35 and vertical ribs 36 are provided to project upward from the horizontal part 38b of the bottom plate 33.

In the bottom plate 33, a plurality of ribs such as, for example, the vertical ribs 36, are formed adjacent to the left and right plates 31L, 31R. The bosses 34 and the vertical ribs 36 extend to the same vertical level as that of the brim portions 53L, 53R (see FIGS. 5B and 6).

As shown in FIG. 6, the lower case 30 is assembled to the upper unit 10, with lower parts of the front and rear surfaces 11, 12 of the upper unit 10 fitted to upper parts of the front and rear plates 54, 32 of the lower case 30. Specifically, the rear plate 32 is fixed to the rear surface 12 from rear using screws 17 inserted through the fastening holes 32a, and screws 14 (see FIG. 1A) are inserted through holes formed in the operation panel surface 13 of the upper unit 10 and then threadedly engaged from above with the bosses 34 of the lower case 30 (see FIGS. 3 and 4B), whereby the housing is constructed.

A power supply board 45 is disposed in the lower case 30 at a location rearward of the concave-forming portion 38, and an input/output terminal board 44 is disposed above the power supply board 45 (see FIGS. 4A, 4B, and 6). These boards 44, 45 are disposed horizontally relative to the operation panel surface 13 and fixed to the lower case 30 by screws or snap fittings. Input/output units 46A, 46B including various terminals, etc. are disposed on and connected to the input/output terminal board 44. The input/output units 46A are exposed upward in a rear part of the operation panel surface 13 of the upper unit 10 (see FIG. 1A), and the input/output unit 46B is disposed to be exposed toward the rear surface of the left half of the rear plate 32 of the lower case 30 (see FIG. 5A).

The input/output terminal board 44 and the power supply board 45, which are heat generating component parts acting as a main heat source in the housing, are located between the heat radiation slits 39 (see FIGS. 2A, 2B, 4A and 4B) and the heat radiation slits 16, 49 (see FIGS. 3 and 5) as viewed in the front-to-rear direction and located close to the heat radiation slits 39, 16, and 49. Thus, the efficiency of heat radiation from the heat radiation slits 39, 16, and 49 is large, whereby the boards 44, 45 are effectively cooled. Furthermore, when the acoustic controller 1 is in a rack-mounted state in particular, the heat radiation slits 39 are located below the boards 44, 45 and the heat radiation slits 16, 49 are located above the boards. Therefore, cool air enters from the heat radiation slits 39, and air having been used for cooling the boards 44, 45 flows through the heat radiation slits 16, 49 upward. As a result, a smooth air flow is naturally generated whereby the cooling effect is enhanced.

As shown in FIG. 6, the operator board 43 is horizontally fixed to the boss 35 on the horizontal part 38b of the concave-forming portion 38 of the lower case 30 using screws (see FIGS. 3 and 4). On the operator board 43, there are disposed various operator groups 47, which are exposed upward in the operation panel surface 13 of the upper unit 10 (see FIG. 1A). The operator groups 47 include function setting component parts and function display component parts (switches, rotary volumes, LEDs, liquid crystal display devices, etc.) of the mixer apparatus. Fader units 15 are disposed on a front part of the operator board 43. Each of the fader units 15 has a fader operator part thereof which is exposed through the operation panel surface 13 and to which a knob 15a is fitted (see FIGS. 1A, 1B, 2A, 2B, etc.). The boards 43, 44, and 45 are electrically connected to one another by bundle wires, not shown. The operator groups 47 can be fixedly disposed on the upper unit 10, not on the lower case 30.

In the fabrication of the acoustic controller 1, the boards 43 to 45 and interior component parts are first disposed in the lower case 30. Then, the upper unit 10 is mounted and threadedly fixed to the open upper part of the lower case 30. Finally, the knobs 15a are attached to the fader units 15.

According to the present embodiment including the lower case 30 made of resin, it is easy to reduce the weight of the lower case 30 and freely design its shape. Specifically, it is easy to add reinforcements to the resin lower case 30 and remove undesired parts thereof for weight reduction, unlike a lower case made of metal and low in the degree of freedom of formation, which is not easy to be added with reinforcements and to have undesired parts thereof removed. With this embodiment, therefore, the acoustic controller 1 can be designed to be suitable even when it is in stationary use. Nevertheless, it can be ensured that the resin lower case 30 has high rigidity by the inverted U-shaped concave-forming portion 38 formed in the bottom plate 33.

The resin lower case 30 is integrally formed with thickened portions such as bosses and ribs. Especially, bosses 34, 35, vertical ribs 36 and other thickened portions are formed in the horizontal part 38b of the concave-forming portion 38 of the bottom plate 33. Height sizes of these thickened portions can be made smaller, as compared to a case where the concave-forming portion 38 is not provided, since the horizontal part 38b of the concave-forming portion 38 is disposed at a vertical position higher than vertical positions of front and rear parts of the bottom plate 33. The provision of the concave-forming portion 38 not only contributes to reduction in thickness and increase in rigidity of the acoustic controller 1, but also prevents the height sizes of thickened portions of the lower case 30 from increasing, whereby moldability of the lower case 30 can be improved.

Since heat radiation slits 39 are formed in the concave-forming portion 38 of the bottom plate 33, there can be increased a distance between the tabletop surface 50 and the heat radiation slits 39 when the acoustic controller 1 is stationarily placed on the tabletop surface 50. In addition, since a concave space defined by the concave-forming portion 38 is in communication with the outside of the controller 1 on the left and right sides thereof when the controller is stationarily placed, there can be attained smooth air conduction between inside and outside of the housing. Thus, it is ensured that the heating generating component parts disposed inside the housing, especially, such as the input/output terminal board 44 and the power supply board 45 disposed near the heat radiation slits 39 (see FIG. 6), can be sufficiently cooled when the controller is stationarily placed. When the acoustic controller 1 is rack-mounted, the heat radiation slits 16, 49 and the heat radiation slits 39 are disposed in a vertical positional relation to each other whereby a cooling air flow is generated. As a result, an inner rear part of the housing, especially, heat generating component parts such as boards 44, 45 can effectively be cooled when the acoustic controller 1 is rack-mounted.

Furthermore, in this embodiment, the brim portions 53L, 53R are projectedly provided in the left and right plates 31L, 31R of the lower case 30 in the front-to-rear direction so as to project outward as viewed in the left-to-right direction when the controller is stationarily placed (see FIG. 3). As a result, after being molded from resin, the left and right plates 31L, 31R are suppressed from being deformed such as being inwardly inclined and/or being undulated in the front-to-rear direction.

In addition, the brim portions 53L, 53R are formed integrally with the lower case 30, and their flanges 40A to 40D having mounting portions 41 (see FIGS. 3 and 4A) also function as rack mount portions. As a result, the number of component parts of the controller 1 can be decreased, and the controller can be simplified in construction, making it possible to reduce costs. Moreover, it is unnecessary to perform operations such as reattaching the flanges 40A to 40D to the housing, even if the controller is changed between stationary use and rack mount use, making it easy to carry out mounting operation.

The brim portions 53L, 53R increase the rigidity of the resin lower case 30, and therefore, it is easy to decrease the height and width of the ribs formed in the lower case 30 used for suppressing the lower case from being deformed and improving the rigidity thereof, making it possible to effectively utilize the internal volume of the lower case 30.

In the above described embodiment, the input/output terminal board 44 and the power supply board 45 are shown by way of example, as heat generating component parts (see FIG. 6), but heat generating component parts to be cooled are not limited thereto. Furthermore, the heat generating component parts are not limited to be disposed in the lower case 30, but can be disposed in the upper unit 10 as long as they are disposed inside the housing.

In the embodiment, the heat radiation slits 39 and the heat radiation slits 16, 49 are disposed in longitudinal positional relation, with the boards 44, 45 interposed therebetween, but the positional relation therebetween is not limited thereto. These slits can be disposed in a lateral or oblique relation. Specifically, in the above described embodiment, the heat generating component parts are disposed mainly in the rear part of the housing, and the heat radiation slits 16, 49 are also formed in the rear part thereof. In a case where the heat generating component parts are located in a front part of the housing, heat radiation slits can be provided on the front part thereof. Heat radiation slits disposed on the side opposite from the heat radiation slits 39 between which heat generating component parts are interposed can be formed in either the upper unit 10 or the lower case 30. By way of example, in the above described embodiment, either heat radiation slits 16 or 49 alone can be provided on the side opposite from the heat radiation slits 39.

As far as from the viewpoint of decreasing the number of component parts and improving the ease of mounting operation, instead of the flanges 40A to 40D, mounting portions not formed into a flange shape can be integrally formed in the lower case 30.

In the above described embodiment, as thickened portions of the lower case 30 whose height sizes are to be suppressed from increasing to improve the moldability of the lower case 30, bosses 34, 35 and vertical ribs 36 are shown by way of example, but they are not limitative. The moldability of the lower case 30 can advantageously be improved by suppressing the height sizes of any thickened portions that are integrally formed in the horizontal part 38b of the concave-forming portion 38 of the lower case 30 in a direction including a vertical direction component for reinforcing the lower case or for mounting the upper unit, etc. on the lower case.

What is claimed is:
1. A housing structure of an acoustic controller, comprising:
 a housing comprised of a lower case and an upper unit having its operation panel surface, the acoustic controller being adapted to be usable both in a stationarily placed state where it is stationarily placed on a flat surface and in a rack-mounted state, wherein the lower case is integrally formed by a resin and has a bottom surface thereof adapted to face the flat surface when the acoustic controller is in the stationarily placed state, the bottom surface of the lower case is formed with a concave-forming portion which is convex upward when the acoustic controller is in the stationarily placed state, and a convex-forming portion disposed at a location rearward of the concave-forming portion so as to be made in contact with the flat surface when the acoustic controller is in the stationarily placed state, at least one heat generating component part is disposed inside the convex-forming portion, the concave-forming portion of the lower case has a part thereof formed with at least a first heat radiation opening, said housing has at least a second heat radiation opening formed therein on a side thereof opposite from the first heat radiation opening, with said heat generating component part interposed between the first and second heat radiation openings, and the first heat radiation opening is located below the at least one heat generating component part and the second heat radiation opening is located above the at least one heat generating component part when the acoustic controller is in the stationarily placed state and in the rack-mounted state.

2. A housing structure of an acoustic controller according to claim 1, wherein the second heat radiation opening is located at a part of the upper unit.

3. A housing structure of an acoustic controller according to claim 1, wherein the second heating radiation opening is located at a part of a rear plate on the lower case extending in a direction including a vertical direction component as viewed when the acoustic controller is in the stationarily placed state.

* * * * *